(12) United States Patent
Walther et al.

(10) Patent No.: US 7,544,959 B2
(45) Date of Patent: Jun. 9, 2009

(54) IN SITU SURFACE CONTAMINATION REMOVAL FOR ION IMPLANTING

(75) Inventors: Steven R. Walther, Andover, MA (US); Sandeep Mehta, Boxford, MA (US); Naushad Variam, Marblehead, MA (US); Ukyo Jeong, Andover, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 0 days.

(21) Appl. No.: 12/099,420

(22) Filed: Apr. 8, 2008

(65) Prior Publication Data

US 2008/0185537 A1 Aug. 7, 2008

Related U.S. Application Data

(63) Continuation of application No. 10/922,710, filed on Aug. 20, 2004, now abandoned.

(51) Int. Cl.
*H01J 37/317* (2006.01)
*H01J 37/36* (2006.01)
*H01L 21/302* (2006.01)

(52) U.S. Cl. .............................. 250/492.21; 250/492.2; 118/723 R; 216/58

(58) Field of Classification Search ............ 250/492.21, 250/492.2; 118/723 R; 216/58
See application file for complete search history.

(56) References Cited

U.S. PATENT DOCUMENTS

| | | | |
|---|---|---|---|
| 4,718,974 A | 1/1988 | Minaee | |
| 4,908,292 A | 3/1990 | Ide et al. | |
| 5,897,713 A | 4/1999 | Tomioka et al. | |
| 6,069,092 A | 5/2000 | Imai et al. | |
| 6,805,139 B1 * | 10/2004 | Savas et al. | 134/1.3 |
| 7,183,177 B2 * | 2/2007 | Al-Bayati et al. | 438/458 |
| 2006/0040499 A1 * | 2/2006 | Walther et al. | 438/689 |

* cited by examiner

*Primary Examiner*—Nikita Wells

(57) ABSTRACT

Methods and apparatus that introduce, within the ion implant chamber or an isolated chamber in communication therewith, the capability to remove contaminants and oxide surface layers on a wafer surface prior to ion implantation, are disclosed. The mechanisms for removal of contaminants include conducting: a low energy plasma etch, heating the wafer and application of ultraviolet illumination, either in combination or individually. As a result, implantation can occur immediately after the cleaning/preparation process without the contamination potential of exposure of the wafer to an external environment. The preparation allows for the removal of surface contaminants, such as water vapor, organic materials and surface oxides.

10 Claims, 2 Drawing Sheets

IN SITU SURFACE CONTAMINATION REMOVAL FOR ION IMPLANTING

CROSS-REFERENCE TO RELATED APPLICATIONS

This application is a continuation of U.S. application Ser. No. 10/922,710, filed Aug. 20, 2004, now abandoned entitled "In Situ Surface Contaminant Removal for Ion Implanting."

BACKGROUND OF THE INVENTION

1. Technical Field

The present invention relates generally to ion implantation, and more particularly, to in situ surface contaminant removal for ion implanting.

2. Related Art

Semiconductor wafers that are to be ion implanted typically have contaminant materials and oxides on the wafer surface. These materials can contaminate the implant process and cause dose non-uniformity and reduced dose retained in the silicon.

Conventional surface preparation procedures include pre-cleaning techniques that are external to an ion implantation chamber. One of these approaches includes stripping of native oxide from the wafer, and exposing the wafer to a high vacuum environment to allow water vapor to evaporate off of the wafer surface. Unfortunately, externally removing oxides still allows for oxide re-growth as the wafer is transported to the implant tool. Accordingly, the performance of devices on the wafer may be limited by the external environment in which they are cleaned. In addition, since the external environment is typically not controlled, the repeatability of the transport conditions also may affect performance.

In view of the foregoing, there is a need in the art for a way to prepare a wafer surface for ion implantation in situ.

SUMMARY OF THE INVENTION

The invention includes a method and apparatus that introduce, within the ion implant chamber or an isolated chamber in communication therewith, the capability to remove contaminants and oxide surface layers on a wafer surface prior to ion implantation. The mechanisms for removal of contaminants include conducting: a low energy plasma etch, heating the wafer and application of ultraviolet illumination, either in combination or individually. As a result, implantation can occur immediately after the cleaning/preparation process without the contamination potential of exposure of the wafer to an external environment. The preparation allows for the removal of surface contaminants, such as water vapor, organic materials and surface oxides.

A first aspect of the invention is directed to an ion implanting apparatus comprising: an implant chamber; means for generating ions for implanting a wafer in the chamber; and means for removing contaminants from a surface of the wafer in situ within the implant chamber.

A second aspect of the invention is directed to a method of removing contaminants from a surface of a wafer in situ of an ion implant apparatus, the method comprising: placing the wafer in an isolated chamber that is in communication with an implant chamber; and removing contaminants from a surface of the wafer in situ within one of the isolated chamber and the implant chamber.

A third aspect of the invention is directed to a method of removing contaminants from a surface of a wafer, the method comprising: placing the wafer in an isolated chamber that is in communication with an implant chamber; and removing contaminants from a surface of the wafer in situ within one of the isolated chamber and the implant chamber by conducting at least one of: exposing the surface to ultraviolet (UV) illumination; heating a platen that holds the wafer in the implant chamber; and controlling a radio frequency (RF) source of the implant chamber to conduct a low energy plasma etch The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 1:
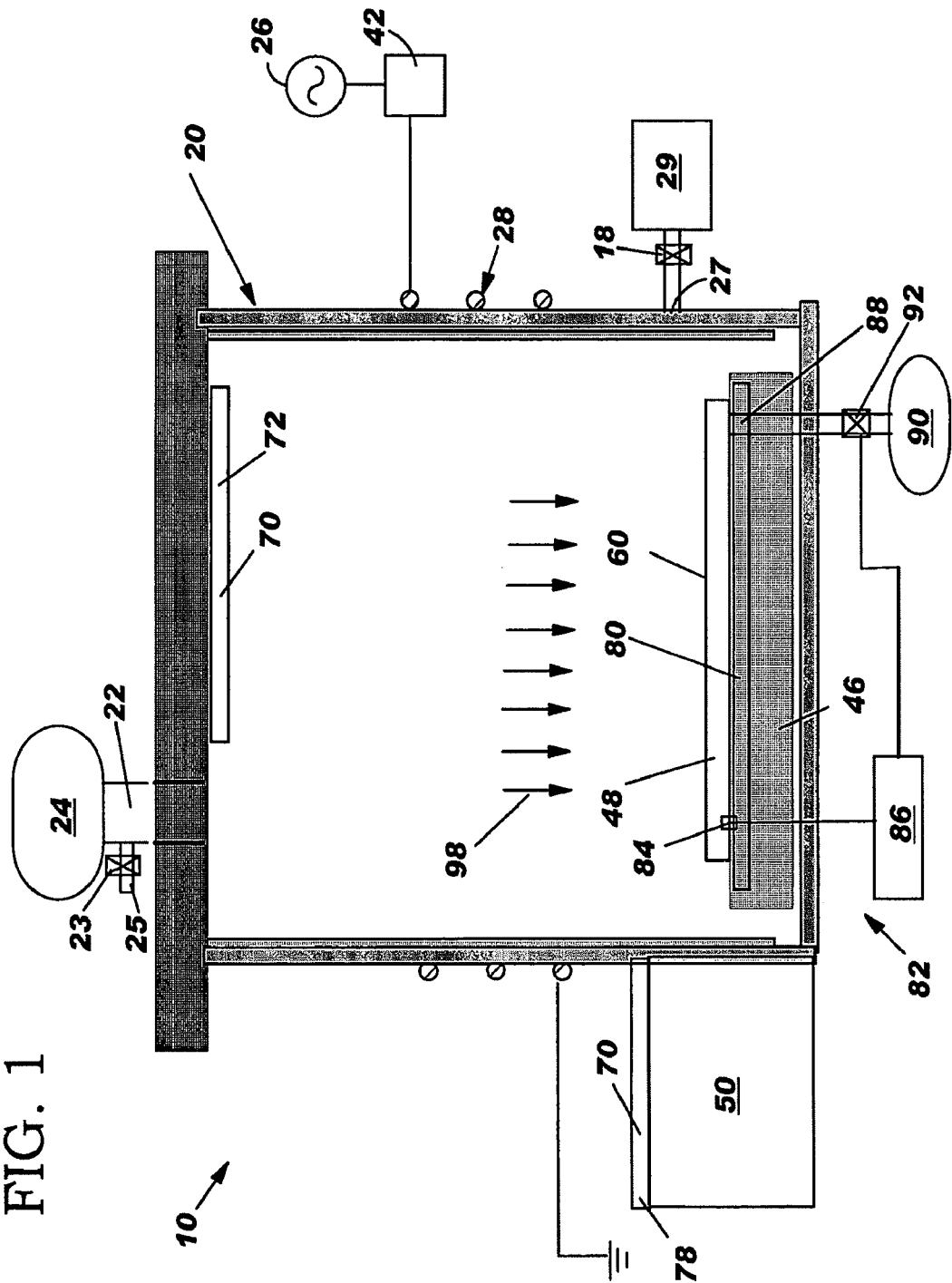
FIG. 1 shows an ion implant apparatus according to a first embodiment of the invention.

Referring to the attached drawings, FIG. 1 shows an ion implant apparatus 10 according to the invention. Apparatus 10 includes an implant chamber 20 configured to receive a process gas 22 from a gas source 24. A gas pressure controller 25 may be provided by, for example, a combination of upstream controller and variable position throttle valve 23. An exhaust port 27 is coupled to one or more vacuum pump(s) 29. Pressure controller 25 operates to maintain implant chamber 20 pressure to a set value by fixing exhaust conductance and varying process gas 22 flow rate in a feedback loop to allow for changing gas demand. A radio frequency (RF) source 26 is configured to resonate radio frequency currents in a radio frequency antenna 28, which pass into implant chamber 20 and excite and ionize process gas 22 to generate plasma within the chamber. RF source 26 is coupled, via an impedance match 42, to antenna 28 that surrounds implant chamber 20. RF source 26 can be either pulsed or continuous. Apparatus 10 also includes a platen 46 for holding a semiconductor wafer 48, to be implanted within implant chamber 20. In an alternative embodiment, ion implant apparatus 10 may function using a glow discharge system in which a pulsed DC voltage (negative) is applied to the cathode (platen 46) as one would do anyway for implant. Under suitable conditions of this wafer bias voltage and process gas 22 pressure (e.g., for −5 kV and 15 mTorr of $BF_3$) a glow discharge plasma is created. This is a pulsed plasma as the wafer bias is a pulsed signal. The pulsed wafer bias voltage is typically applied to platen 46 with the other conductive chamber components connected to electrical ground. The plasma may also be created by biasing a third electrode synchronously with the wafer bias, which may be used in cases where the wafer bias is too small to create the plasma. The pulsed DC voltage applied depends on the desired implant energy and process gas 22 used. In this case, RF source 26 is not necessary. In another alternative embodiment, the above-described plasma immersion ion implanter devices may be replaced by, for example, a low energy beamline implanter (not shown). In any case, an isolated chamber 50 that is sealed for transport of wafers 48 to implant chamber 20 is also included. Isolated chamber 50 can include any now known or later developed load locks or wafer handler chambers.

The invention also includes a number of mechanisms for removing contaminants from a surface 60 of wafer 48.

Figure 2:
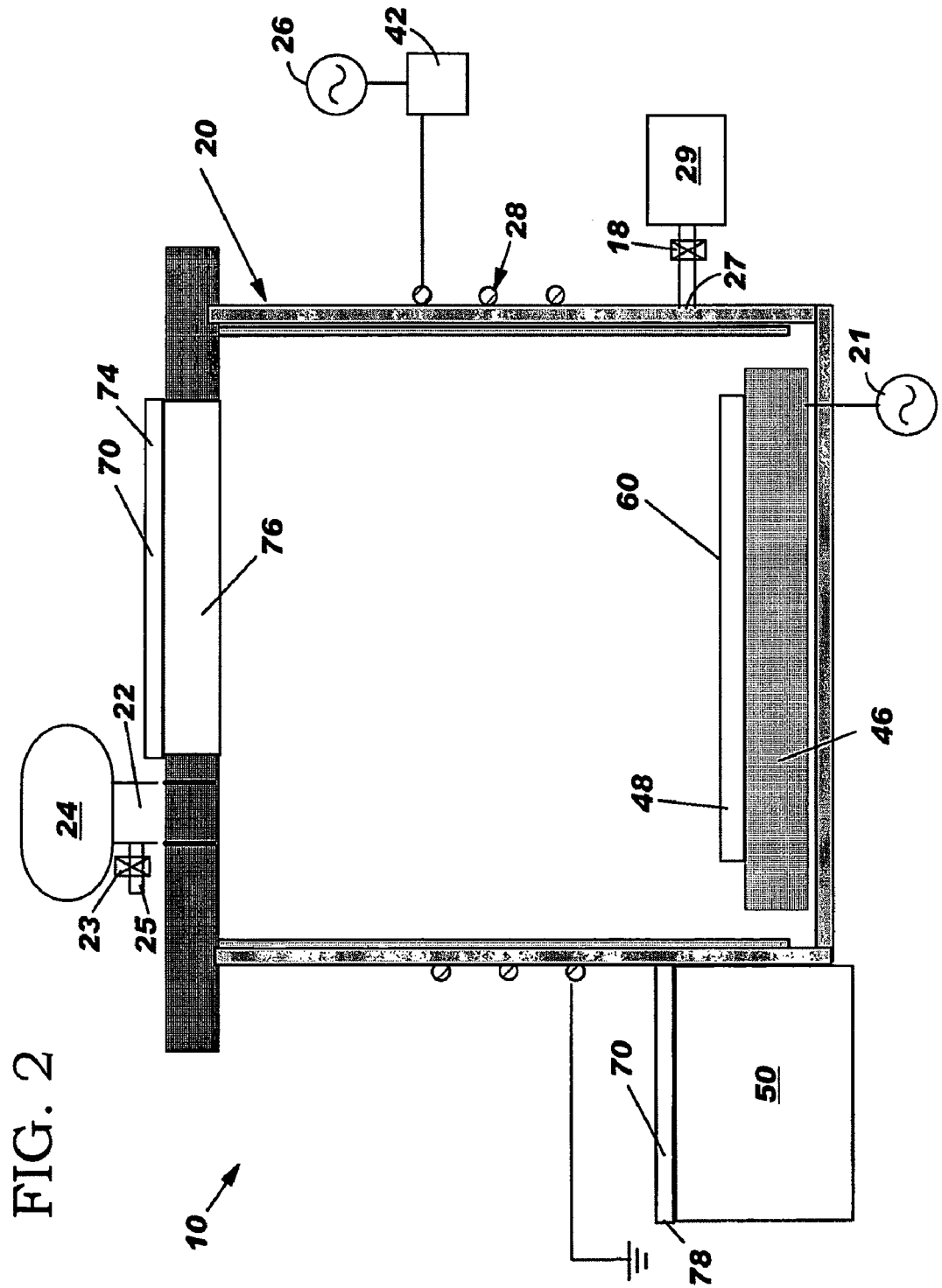
FIG. 2 shows an ion implant apparatus according to a second embodiment of the invention.

A first mechanism includes exposing wafer 48 to ultraviolet light. In this case, one or more ultraviolet illumination devices 70 may be employed for exposing surface 60 to ultraviolet (UV) illumination. In one embodiment, as shown in FIG. 1, a UV illumination device 72 is mounted within implant chamber 20. However, in another embodiment, as shown in FIG. 2, a UV illumination device 74 is mounted externally of process chamber 20 and transmits UV light through a window 76 of process chamber 20. In another embodiment, a UV illumination device 78 may also be mounted to transmit UV light into isolated chamber 50 so that a wafer 48 may be de-contaminated during transport. Alternatively, to the above-described embodiments that transmit UV light into implant chamber 20, UV light may also be produced by RF source 26 resonating radio frequency currents to produce a UV emitting plasma, or by the above-described glow discharge system producing a UV emitting plasma. Removal of contaminants under any of the UV light exposure embodiments also preferably includes exposing wafer 48 to a vacuum of better than $1 \times 10^{-5}$ Torr (pressure equal to that value or less) by one or more vacuum pump(s) 29. When UV light is used in isolated chamber 50, a vacuum may also be applied therein in a conventional fashion.

A second mechanism for removing contaminants from surface 60 includes, as shown in FIG. 1, heating wafer 48. In one embodiment, this mechanism is implemented by heating platen 46 so as to heat wafer 48 in implant chamber 20. It should be recognized, however, that a variety of other mechanisms may be implemented to heat wafer 48, and the invention should not be limited other than as set out in the attached claims. In the former case, platen 46 may be provided with a heater 80 such as one or more embedded heating coils. This mechanism may also include a temperature controller 82 for heater 80 including a thermocouple 84 and a heater controller 86. A gas portal 88 may also be provided for introducing a gas 90 between platen 46 and wafer 48 to improve heat transfer. Gas 90 flow may be controlled by heater controller 86 by controlling a valve 92. Removal of contaminants by heating wafer 48 also preferably includes exposing wafer 48 to a high vacuum of better than $1 \times 10^{-5}$ Torr (pressure equal to that value or less) by one or more vacuum pump(s) 29.

A third mechanism for removing contaminants includes, as shown in FIG. 1, controlling RF source 26 to conduct a low energy plasma etch 98. Alternatively, a pulsed glow discharge approach may be implemented that conducts a low energy plasma etch 98. In either case, low energy plasma etch 98 uses no greater than −1000 V of wafer bias, with a suitable etching process gas (e.g., $NF_3$, $SiF_4$, $BF_3$, $F_2$, $H_2$ etc.). In one example, low energy plasma etch 98 may use one of: $BF_3$, $NF_3$ and $F_2$ as a plasma gas source for a subsequent $BF_3$ plasma implantation. The duration process may be controlled by monitoring the wafer pulsing current to detect the change in secondary electron emission as the wafer surface is altered.

A method of removing contaminants from a surface of a wafer 46 according to the invention includes placing wafer 48 in isolated chamber 50 that is in communication with implant chamber 20, and then removing contaminants from surface 60 of wafer 48 in situ within one of isolated chamber 50 and implant chamber 20. The removing step includes conducting at least one of: exposing surface 60 to ultraviolet (UV) illumination; heating wafer 48; and controlling RF source 26 of implant chamber 20 to conduct low energy plasma etch 98.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. An ion implantation method comprising:
   biasing a wafer positioned in an implant chamber to a first bias voltage level, said first bias voltage level configured to perform a low energy plasma etch to remove contaminants from a surface of said wafer during a vacuum condition; and
   biasing said wafer to a second bias voltage level larger in magnitude than said first bias voltage level after biasing said wafer to said first bias voltage level without breaking said vacuum condition, said second bias voltage level configured to accelerate ions within a plasma for ion implantation into said wafer.

2. The ion implantation method of claim 1, wherein said first bias voltage level is no greater than −1,000 V.

3. The ion implantation method of claim 1, wherein said first bias voltage level is between 0 V and −1,000 V and said second bias voltage level is about −5,000 V.

4. The ion implantation method of claim 1, wherein said method further comprises providing at least one process gas to said implant chamber.

5. The ion implantation method of claim 4, wherein a first process gas is provided during said biasing of said wafer at said first bias voltage level.

6. The ion implantation method of claim 5, wherein said first process gas is selected from the group consisting of $NF_3$, $SiF_4$, $BF_3$, $F_2$, and $H_2$.

7. The ion implantation method of claim 4, wherein a second process gas is provided during said biasing of said wafer at said second bias voltage level.

8. The ion implantation method of claim 7, wherein said second process gas is $BF_3$.

9. The ion implantation method of claim 1, further comprising monitoring change in secondary electron emission from said wafer.

10. The ion implantation method of claim 9, further comprising controlling the duration of at least one of said first bias voltage level and said second bias voltage level based on said monitoring.

* * * * *